(12) United States Patent
Ma et al.

(10) Patent No.: US 12,640,216 B2
(45) Date of Patent: May 26, 2026

(54) MEMORY SYSTEM, METHOD OF OPERATING MEMORY SYSTEM, AND COMPUTER-READABLE STORAGE MEDIUM

(71) Applicant: YANGTZE MEMORY TECHNOLOGIES CO., LTD., Wuhan (CN)

(72) Inventors: Lingling Ma, Wuhan (CN); Lu Guo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 131 days.

(21) Appl. No.: 18/240,180

(22) Filed: Aug. 30, 2023

(65) Prior Publication Data

US 2024/0428873 A1      Dec. 26, 2024

Related U.S. Application Data

(63) Continuation of application No. PCT/CN2023/102212, filed on Jun. 25, 2023.

(51) Int. Cl.
| | |
|---|---|
| *G11C 29/02* | (2006.01) |
| *G11C 8/08* | (2006.01) |
| *G11C 29/52* | (2006.01) |

(52) U.S. Cl.
CPC .............. *G11C 29/022* (2013.01); *G11C 8/08* (2013.01); *G11C 29/52* (2013.01)

(58) Field of Classification Search
CPC ......... G11C 29/022; G11C 8/08; G11C 29/52; G06F 3/0614; G06F 3/0604;
(Continued)

(56) References Cited

U.S. PATENT DOCUMENTS

| | | |
|---|---|---|
| 9,720,609 B1 | 8/2017 | Yan et al. |
| 2014/0075259 A1 | 3/2014 | Tam |

(Continued)

FOREIGN PATENT DOCUMENTS

| | | |
|---|---|---|
| CN | 110942795 A | 3/2020 |
| CN | 114333949 A | 4/2022 |

(Continued)

OTHER PUBLICATIONS

Supplementary European Search Report issued in corresponding European Application No. 23924477.5, mailed on Aug. 22, 2025.
(Continued)

*Primary Examiner* — Amir Zarabian
*Assistant Examiner* — Minh Dinh
(74) *Attorney, Agent, or Firm* — BAYES PLLC

(57)      ABSTRACT

According to one aspect of the present disclosure, a memory system is provided. the memory system may include at least one memory. The at least one memory may include a memory array coupled to n wordlines. The n wordlines may be sequentially arranged by physical wordline identifiers, where $n \geq 2$. The memory system may include a memory controller coupled to the at least one memory. The memory controller may obtain multiple pieces of data to be written into the memory array. The memory controller may map n physical wordline identifiers to n virtual wordline identifiers. The physical wordline identifiers may respectively correspond to m adjacent virtual wordline identifiers spaced apart from each other, where $2 \leq m \leq n$. The memory controller may generate check data based on data corresponding to the m
(Continued)

adjacent virtual wordline identifiers. The check data may check and recover the data corresponding to the m adjacent virtual wordline identifiers.

20 Claims, 6 Drawing Sheets

(58) Field of Classification Search
CPC .. G06F 3/0658; G06F 3/0659; G06F 12/0292; G06F 2212/1016; G06F 2212/1032
USPC ...................................................... 365/185.09
See application file for complete search history.

(56) References Cited

U.S. PATENT DOCUMENTS

| | | | |
|---|---|---|---|
| 2015/0363266 | A1 | 12/2015 | Hu et al. |
| 2016/0283319 | A1 | 9/2016 | Chou |
| 2018/0203642 | A1 | 7/2018 | Sharma et al. |
| 2018/0307431 | A1 | 10/2018 | Gunnam et al. |
| 2020/0185040 | A1 | 6/2020 | Bhatia et al. |
| 2020/0194094 | A1 | 6/2020 | Yang et al. |
| 2022/0076773 | A1 | 3/2022 | Tokutomi et al. |
| 2023/0052161 | A1* | 2/2023 | Seok ................... G11C 11/5642 |

FOREIGN PATENT DOCUMENTS

| | | | |
|---|---|---|---|
| CN | 114649043 | A | 6/2022 |
| JP | 2011134307 | A | 7/2011 |
| JP | 2018041403 | A | 3/2018 |
| KR | 101877824 | B1 | 7/2018 |
| KR | 20200085519 | A | 7/2020 |
| KR | 20230024543 | A | 2/2023 |

OTHER PUBLICATIONS

Wang Yi et al., "A Reliability Enhanced Address Mapping Strategy for Three-Dimensional (3-D) NAND Flash Memory", IEEE Transactions on Very Large Scale Integration (VLSI) Systems, IEEE Service Center, Piscataway, NJ USA, vol. 22, No. 11, Dec. 5, 2013, pp. 2402-2410.
Communication pursuant to Article 94(3)EPC issued in corresponding European Application No 23924477.5, mailed on Mar. 16, 2026, 8 pages.

* cited by examiner

<u>10</u>

100

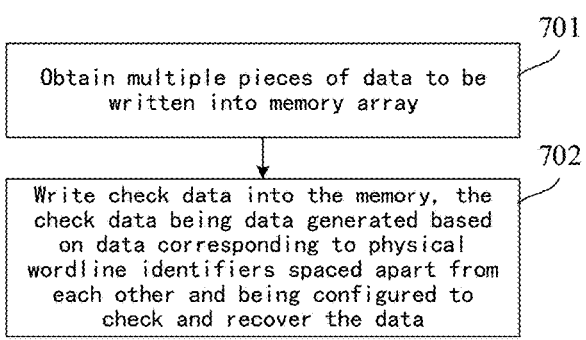

701

Obtain multiple pieces of data to be
written into memory array

702

Write check data into the memory, the
check data being data generated based
on data corresponding to physical
wordline identifiers spaced apart from
each other and being configured to
check and recover the data

Fig. 7

| Virtual wordline identifier 810 | Physical wordline identifier 820 | Data830 | | | | | Check data 840 |
|---|---|---|---|---|---|---|---|
| 1-5 | 1/6/11/16/21 | Data1 | Data6 | Data11 | Data16 | Data21 | Parity1 |
| 6-10 | 26/31/36/41/46 | Data26 | Data31 | Data36 | Data41 | Data46 | Parity2 |
| 11-15 | 51/56/61/66 | Data51 | Data56 | Data61 | Data66 | Data71 | Parity3 |
| ... | ... | ... | ... | ... | ... | ... | ... |
| ... | 2/7/12/17/22 | Data2 | Data7 | Data12 | Data17 | Data22 | Parity |
| ... | ... | ... | ... | ... | ... | ... | ... |
| ... | 3/8/13/18/23 | Data3 | Data8 | Data13 | Data18 | Data23 | Parity |
| ... | ... | ... | ... | ... | ... | ... | ... |

Fig. 8

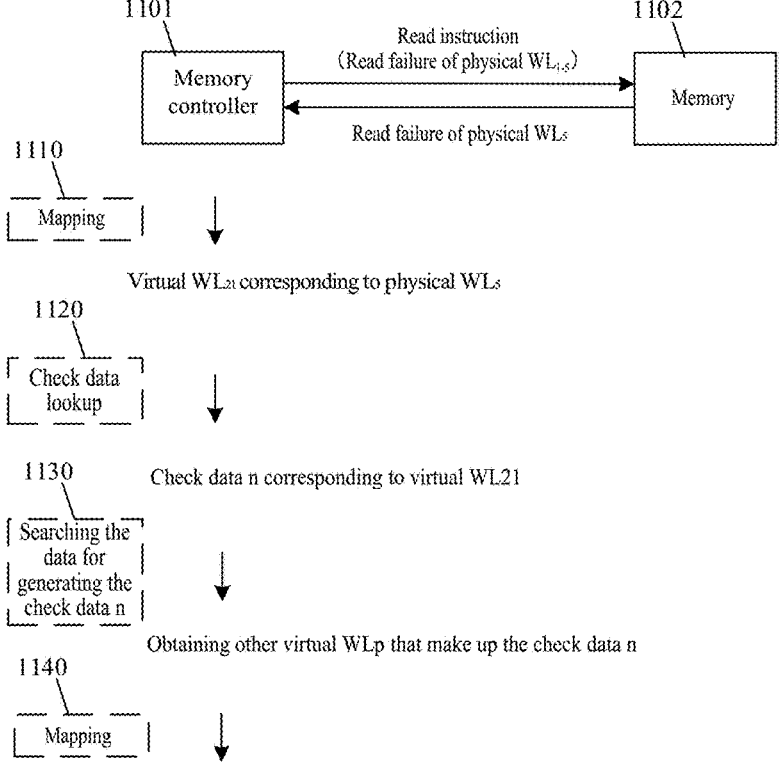
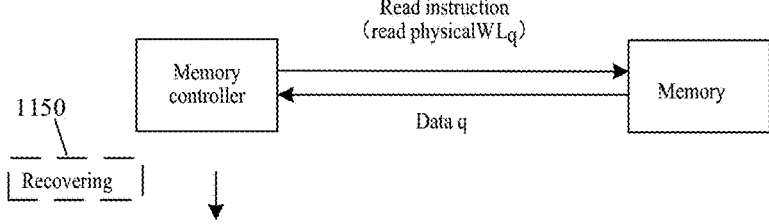
Determining data corresponding to physical WL₅ according to check data n and data q
Fig. 11
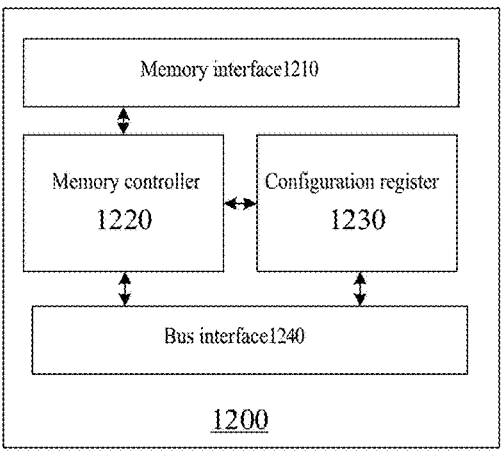
Fig. 12

MEMORY SYSTEM, METHOD OF OPERATING MEMORY SYSTEM, AND COMPUTER-READABLE STORAGE MEDIUM

CROSS-REFERENCE TO RELATED APPLICATIONS

This application is a continuation of International Application No. PCT/CN2023/102212, filed on Jun. 25, 2023, the content of which is incorporated herein by reference in its entirety.

TECHNICAL FIELD

The present application relates to the field of storage technologies, and in particular to a memory system, a method of operating the memory system, and a computer-readable storage medium.

BACKGROUND

A memory cell in a three-dimensional (3D) memory is coupled to a wordline, and data is written into the memory cell through a program voltage applied by the wordline.

When writing data into the 3D memory, check data may be generated according to the written data in order to avoid errors in subsequent data reading. In this way, when data is read from the memory, the read data is checked according to the check data, and if the check fails, correct data can be restored according to the check data. Ensuring the successful recovery of data when the check fails becomes a current research hotspot.

SUMMARY

According to one aspect of the present disclosure, a memory system is provided. the memory system may include at least one memory. The at least one memory may include a memory array coupled to n wordlines. The n wordlines may be sequentially arranged by physical wordline identifiers, where n≥2. The memory system may include a memory controller coupled to the at least one memory. The memory controller may be configured to obtain multiple pieces of data to be written into the memory array. The memory controller may be configured to map n physical wordline identifiers to n virtual wordline identifiers. The physical wordline identifiers may respectively correspond to m adjacent virtual wordline identifiers spaced apart from each other, where 2≤m≤n. The memory controller may be configured to generate check data based on data corresponding to the m adjacent virtual wordline identifiers. The check data may be configured to check and recover the data corresponding to the m adjacent virtual wordline identifiers.

In some implementations, the memory controller may be further configured to obtain a preset mapping relationship table. In some implementations, the mapping relationship table may include mapping correspondence between the physical wordline identifiers and the virtual wordline identifiers. In some implementations, the memory controller may be further configured to obtain the n virtual wordline identifiers corresponding to the n physical wordline identifiers by matching the n physical wordline identifiers with the mapping relationship table.

In some implementations, the memory controller may be further configured to obtain the preset mapping relationship table from a static random access memory.

In some implementations, a reference number of the physical wordline identifiers are distributed between the physical wordline identifiers respectively corresponding to the m adjacent virtual wordline identifiers.

In some implementations, the memory controller may be further configured to obtain a preset algorithm. In some implementations, the preset algorithm may be configured to map the physical wordline identifiers to the virtual wordline identifiers. In some implementations, the memory controller may be further configured to substitute the n physical wordline identifiers into the preset algorithm to obtain the n virtual wordline identifiers corresponding to the n physical wordline identifiers.

In some implementations, the memory controller may be further configured to process the data corresponding to the m adjacent virtual wordline identifiers through a first operator to obtain the check data. In some implementations, the check data may be configured to check and recover the data that failed to be read through a second operator when there is a data reading failure in the data corresponding to the m adjacent virtual wordline identifiers. In some implementations, the first operator and the second operator may be operators whose operation logics are opposite.

In some implementations, the memory controller may be further configured to send a first read instruction to the memory. In some implementations, the first read instruction may include a first physical wordline identifier corresponding to first data to be read. In some implementations, the memory controller may be further configured to receive a data read result returned by the memory. In some implementations, the memory controller may be further configured to determine a first virtual wordline identifier corresponding to the first physical wordline identifier when the data read result indicates that the reading of the first data corresponding to the first physical wordline identifier fails. In some implementations, the memory controller may be further configured to obtain target check data corresponding to the first virtual wordline identifier to recover the first data that failed to be read.

In some implementations, the memory controller may be further configured to obtain the target check data corresponding to the first virtual wordline identifier. In some implementations, the memory controller may be further configured to obtain a second virtual wordline identifier that is matched with the first virtual wordline identifier to generate the target check data. In some implementations, the memory controller may be further configured to determine a second physical wordline identifier corresponding to the second virtual wordline identifier. In some implementations, the memory controller may be further configured to send a second read instruction to the memory. In some implementations, the second read instruction may include the second physical wordline identifier and be configured to instruct the memory to read the data stored in memory cell rows coupled to the wordline corresponding to the second physical wordline identifier. In some implementations, the memory controller may be further configured to receive second data that is returned by the memory and corresponds to the second physical wordline identifier. In some implementations, the memory controller may be further configured to recover the first data that failed to be read based on the target check data and the second data.

In some implementations, the memory controller may be further configured to determine a first virtual wordline identifier corresponding to a first physical wordline identifier when reading first data corresponding to the first physical wordline identifier. In some implementations, the memory controller may be further configured to obtain the target check data corresponding to the first virtual wordline identifier. In some implementations, the memory controller may be further configured to obtain a second virtual wordline identifier that is matched with the first virtual wordline identifier to generate the target check data. In some implementations, the memory controller may be further configured to determine a second physical wordline identifier corresponding to the second virtual wordline identifier. In some implementations, the memory controller may be further configured to send a read instruction to the memory, the read instruction being configured to instruct to read the data stored in memory cell rows coupled to the wordline corresponding to the first physical wordline identifier and the second physical wordline identifier. In some implementations, the memory controller may be further configured to receive a data read result returned by the memory. In some implementations, the memory controller may be further configured to, when the data read result indicates that the reading of the first data fails, use the target check data and the second data corresponding to the second physical wordline identifier to recover the first data that failed to be read.

According to another aspect of the present disclosure, a method of operating a memory is provided. The method may include obtaining multiple pieces of data to be written into a memory array of the memory. The memory array may be coupled to n wordlines. The n wordlines may be sequentially arranged by physical wordline identifiers, where n≥2. The memory may include writing check data into the memory. The check data may be data generated based on data corresponding to physical wordline identifiers spaced apart from each other and being configured to check and recover data.

In some implementations, prior to the writing the check data into the memory, the method may further include mapping n physical wordline identifiers into n virtual wordline identifiers. In some implementations, the physical wordline identifiers may respectively correspond to m adjacent virtual wordline identifiers spaced apart from each other, where 2≤m≤n. In some implementations, prior to the writing the check data into the memory, the method may further include generating the check data based on data corresponding to the m adjacent virtual wordline identifiers. In some implementations, the check data may be configured to check and recover the data corresponding to the m adjacent virtual wordline identifiers.

In some implementations, the mapping the n physical wordline identifiers into the n virtual wordline identifiers may include obtaining a preset mapping relationship table. In some implementations, the mapping relationship table may include mapping correspondence between the physical wordline identifiers and the virtual wordline identifiers. In some implementations, the mapping the n physical wordline identifiers into the n virtual wordline identifiers may include obtaining the n virtual wordline identifiers corresponding to the n physical wordline identifiers by matching the n physical wordline identifiers with the mapping relationship table.

In some implementations, the obtaining the preset mapping relationship table may include obtaining the preset mapping relationship table from a static random access memory.

In some implementations, a reference number of the physical wordline identifiers may be distributed between physical wordline identifiers respectively corresponding to the m adjacent virtual wordline identifiers.

In some implementations, the mapping the n physical wordline identifiers into the n virtual wordline identifiers may include obtaining a preset algorithm, the preset algorithm being configured to map the physical wordline identifiers to the virtual wordline identifiers. In some implementations, the mapping the n physical wordline identifiers into the n virtual wordline identifiers may include substituting the n physical wordline identifiers into the preset algorithm to obtain the n virtual wordline identifiers corresponding to the n physical wordline identifiers.

In some implementations, the generating the check data based on the data corresponding to the m adjacent virtual wordline identifiers may include processing the data corresponding to the m adjacent virtual wordline identifiers through a first operator to obtain the check data. In some implementations, the check data may be configured to check and recover the data that failed to be read through a second operator when there is a data reading failure in the data corresponding to the m adjacent virtual wordline identifiers. In some implementations, the first operator and the second operator may be operators whose operation logics are opposite.

In some implementations, after writing the check data to the memory, the method may further include sending a first read instruction to the memory. In some implementations, the first read instruction may be a first physical wordline identifier corresponding to first data to be read. In some implementations, after writing the check data to the memory, the method may further include receiving a data read result returned by the memory. In some implementations, after writing the check data to the memory, the method may further include determining a first virtual wordline identifier corresponding to the first physical wordline identifier when the data read result indicates that the reading of the first data corresponding to the first physical wordline identifier fails. In some implementations, after writing the check data to the memory, the method may further include obtaining target check data corresponding to the first virtual wordline identifier to recover the first data that failed to be read.

In some implementations, the obtaining the target check data corresponding to the first virtual wordline identifier to recover the first data that failed to be read may include obtaining the target check data corresponding to the first virtual wordline identifier, and obtaining a second virtual wordline identifier that is matched with the first virtual wordline identifier to generate the target check data. In some implementations, the obtaining the target check data corresponding to the first virtual wordline identifier to recover the first data that failed to be read may include determining a second physical wordline identifier corresponding to the second virtual wordline identifier. In some implementations, the obtaining the target check data corresponding to the first virtual wordline identifier to recover the first data that failed to be read may include sending a second read instruction to the memory. In some implementations, the second read instruction may include the second physical wordline identifier. In some implementations, the second read instruction may be configured to instruct the memory to read the data stored in memory cell rows coupled to the wordline corresponding to the second physical wordline identifier. In some implementations, the obtaining the target check data corresponding to the first virtual wordline identifier to recover the first data that failed to be read may include receiving second data that is returned by the memory and corresponds to the second physical wordline identifier. In some implementations, the obtaining the target check data corresponding to the first virtual wordline identifier to recover the first data that failed to be read may include recovering the first data that failed to be read based on the target check data and the second data.

In some implementations, after generating the check data based on the data corresponding to the m adjacent virtual wordline identifiers, the method may further include sending a first read instruction to the memory. In some implementations, the first read instruction may include a first physical wordline identifier corresponding to the first data to be read. In some implementations, after generating the check data based on the data corresponding to the m adjacent virtual wordline identifiers, the method may further include determining a first virtual wordline identifier corresponding to the first physical wordline identifier. In some implementations, after generating the check data based on the data corresponding to the m adjacent virtual wordline identifiers, the method may further include obtaining the target check data corresponding to the first virtual wordline identifier. In some implementations, after generating the check data based on the data corresponding to the m adjacent virtual wordline identifiers, the method may further include obtaining a second virtual wordline identifier that is matched with the first virtual wordline identifier to generate the target check data. In some implementations, after generating the check data based on the data corresponding to the m adjacent virtual wordline identifiers, the method may further include determining a second physical wordline identifier corresponding to the second virtual wordline identifier. In some implementations, after generating the check data based on the data corresponding to the m adjacent virtual wordline identifiers, the method may further include sending a second read instruction to the memory. In some implementations, the second read instruction may include the second physical wordline identifier and may be configured to instruct the memory to read the data stored in memory cell rows coupled to the wordline corresponding to the second physical wordline identifier. In some implementations, after generating the check data based on the data corresponding to the m adjacent virtual wordline identifiers, the method may further include receiving a data read result returned by the memory. In some implementations, after generating the check data based on the data corresponding to the m adjacent virtual wordline identifiers, the method may further include, when the data read result indicates that the reading of the first data fails, using the target check data and the second data corresponding to the second physical wordline identifier to recover the first data that failed to be read.

According to a further aspect of the present disclosure, a computer-readable storage medium having stored therein instructions is provided. The instructions, which when executed on a memory controller, may cause the memory controller to perform obtaining multiple pieces of data to be written into a memory array of a memory. The memory array may be coupled to n wordlines. The n wordlines may be sequentially arranged by physical wordline identifiers, where n≥2. The instructions, which when executed on a memory controller, may cause the memory controller to perform writing check data into the memory, the check data being data generated based on data corresponding to physical wordline identifiers spaced apart from each other and being configured to check and recover data.

6

Figure 2:
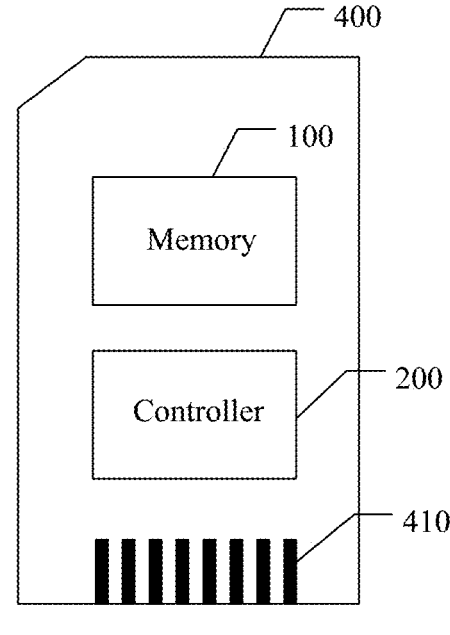

FIG. 2 is a schematic diagram of an integration scenario of a memory system, according to an example implementation of the present application.

Figure 3:
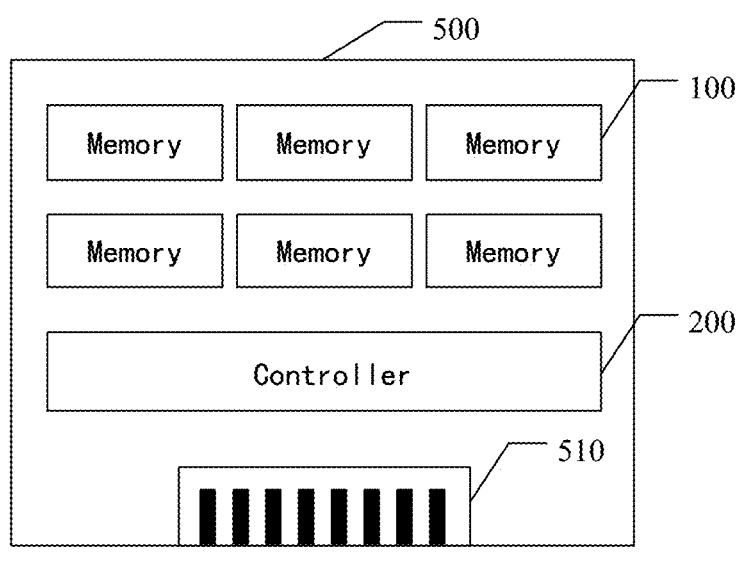

FIG. 3 is a schematic diagram of an integration scenario of a memory system, according to another example implementation of the present application.

Figure 4:
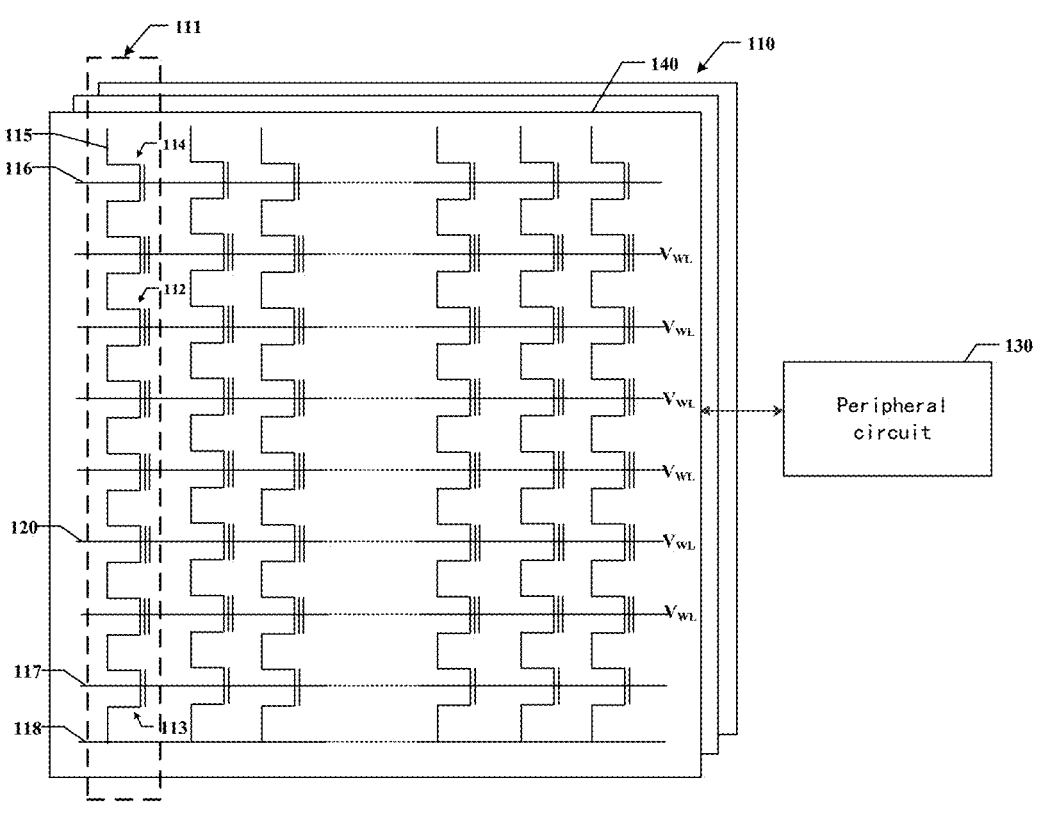

FIG. 4 is a schematic diagram of a memory, according to an implementation of the present application.

Figure 5:
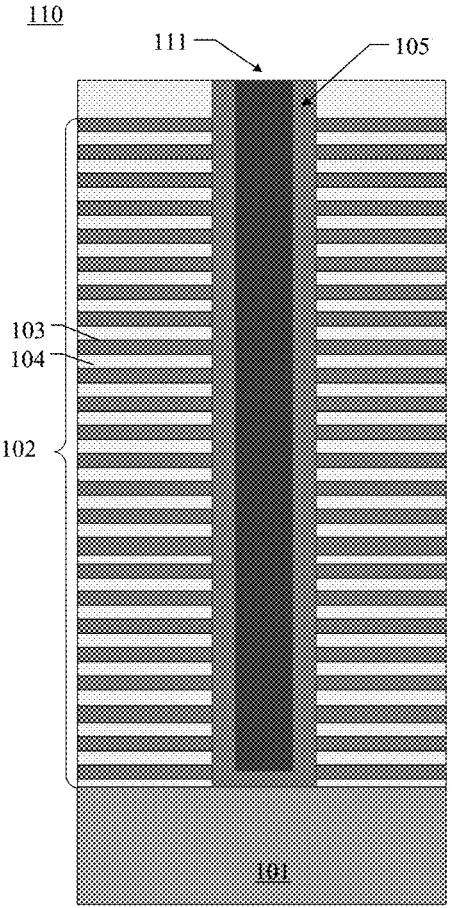

FIG. 5 is a schematic cross-sectional view of a memory array including memory strings, according to an implementation of the present application.

Figure 6:
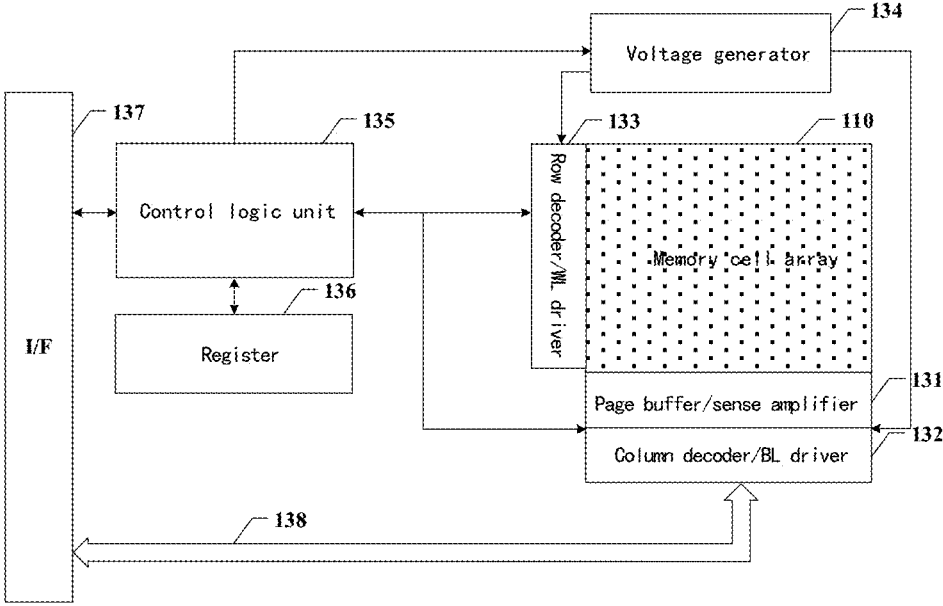

FIG. 6 is a schematic diagram of a peripheral circuit, according to an implementation of the present application.

FIG. 7 is a flow chart of an method of operating a memory system, according to an example implementation of the present application.

FIG. 8 is a schematic diagram of a mapping relationship table, according to an example implementation of the present application.

Figure 9:
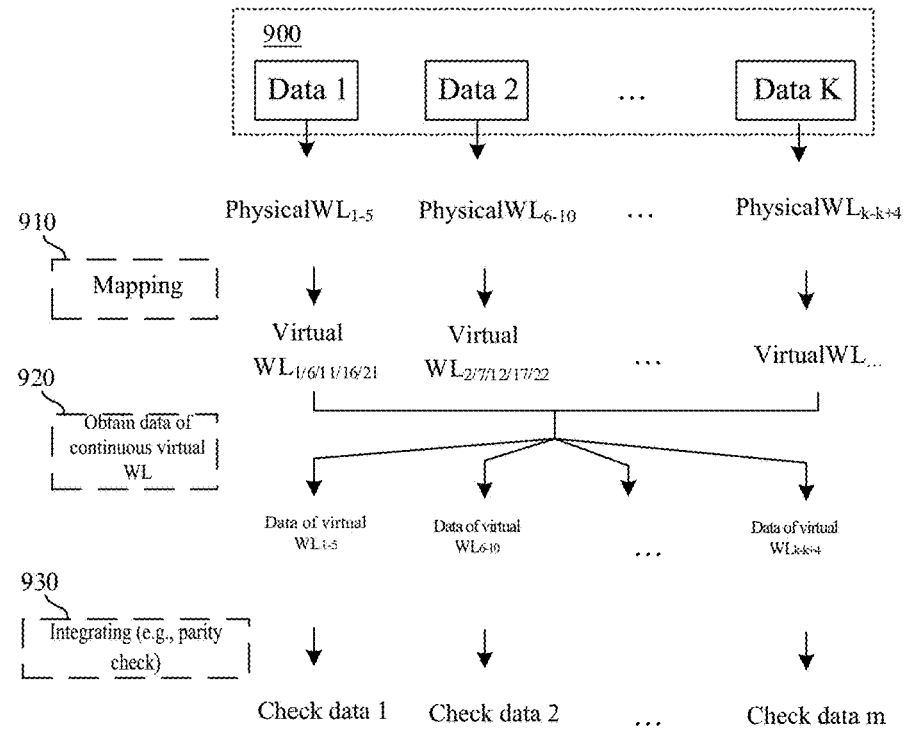

FIG. 9 is a schematic diagram of a check data generation process, according to an example implementation of the present application.

Figure 10:
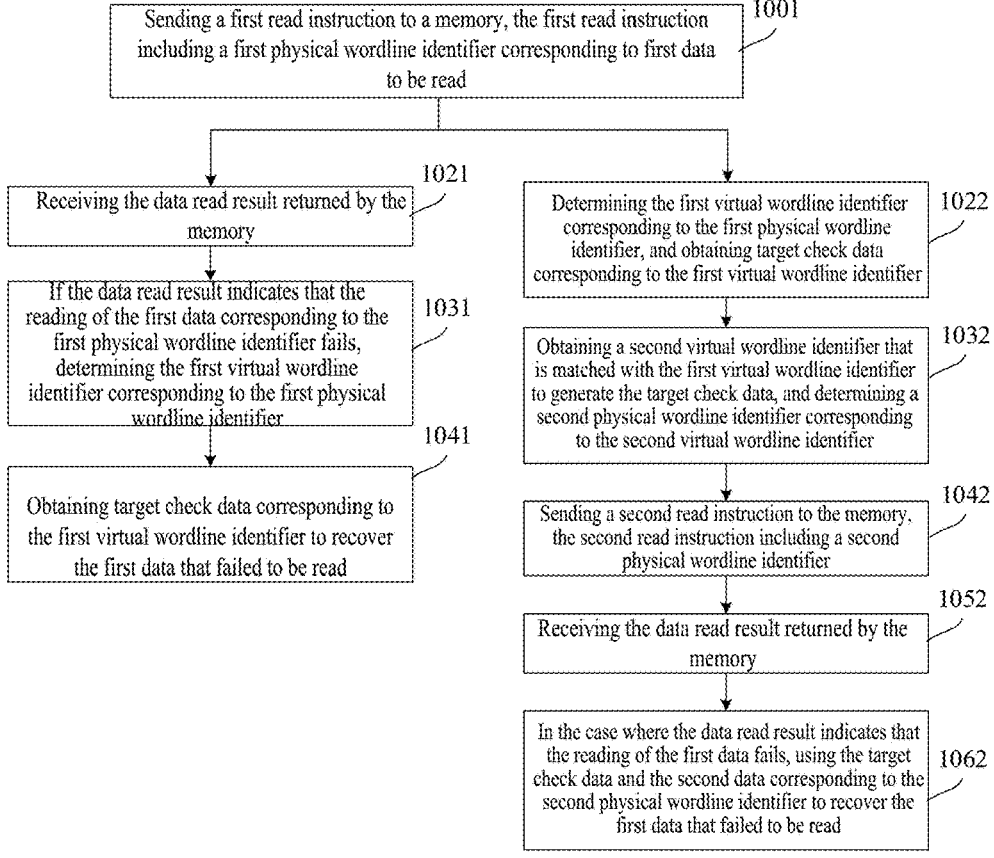

FIG. 10 is a flow chart of an method of operating a memory system, according to another example implementation of the present application.

FIG. 11 is a schematic diagram of data check and recovery process, according to an example implementation of the present application.

FIG. 12 is a schematic structural diagram of a memory controller, according to an example implementation of the present application.

DETAILED DESCRIPTION

Implementations of the present application will be further described in detail below in conjunction with the accompanying drawings.

A method of operating a memory system provided in the implementations of the present application can be applied to the memory system. The memory system may include a 3D memory, such as a 3D NAND flash.

Figure 1:
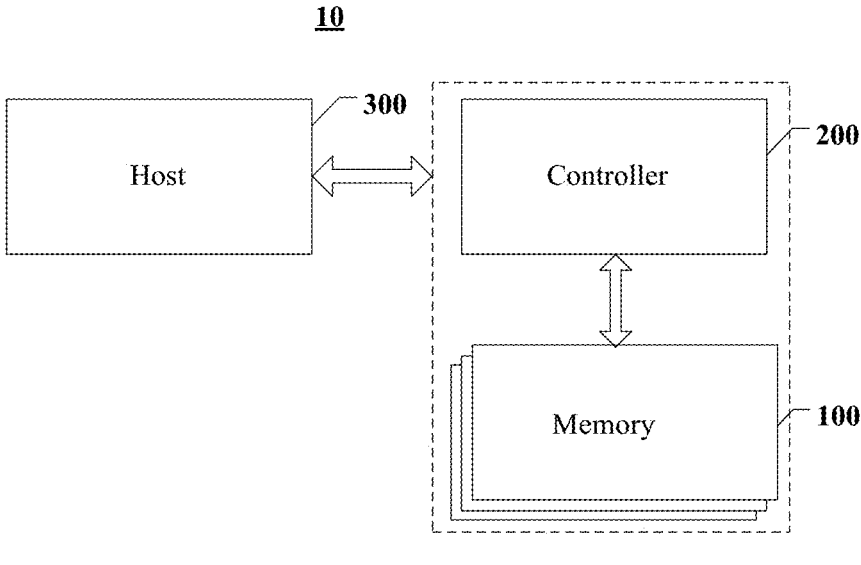
FIG. 1 is a schematic structural diagram of a memory system, according to an implementation of the present application.

FIG. 1 is a schematic diagram of a memory system 10, according to an implementation of the present application. As shown in FIG. 1, the memory system 10 may include at least one memory 100 (referred to hereinafter as "memory 100") and a memory controller 200 coupled to the at least one memory 100 and configured to control the memory 100.

The memory controller 200 may be configured to control operations performed by the memory 100, e.g., such as read, erase and program operations. The memory controller 200 may be further configured to manage various functions regarding data stored or to be stored in the memory 100, including, but not limited to, e.g., bad block management, garbage collection, logical-to-physical address translation, wear leveling, and the like. In some examples, the memory controller 200 may also be configured to process an Error Correcting Code (ECC) on data read from or written into the memory 100. The memory controller 200 may also perform any other suitable functions, for example, formatting the memory 100.

The memory controller 200 can also communicate with external devices according to a specific communication protocol. For example, the memory controller 200 may communicate with external devices via at least one of various interface protocols. The interface protocol can be Universal Serial Bus (USB) protocol, Multi-Media card (MMC) protocol, Peripheral Component Interconnect (PCI)

protocol, PCI Express (PCI-E) protocol, Advanced Technology Attachment (ATA) protocol, Serial ATA protocol, Parallel ATA protocol, Small Computer System Interface (SCSI) protocol, Enhanced Small Drive Interface (ESDI) protocol, Integrated Drive Electronics (IDE) protocol, Firewire protocol, etc.

In some implementations, the memory controller 200 and the memory 100 can be integrated into various types of electronic devices. The electronic device may be a mobile phone, a desktop computer, a laptop computer, a tablet computer, a vehicle computer, a game console, a printer, a pointing device, a wearable electronic device, a smart sensor, a Virtual Reality (VR) device, an Augmented Reality (AR) device, or any other suitable electronic device having storage therein. In this scenario, as shown in FIG. 1, the memory system 10 further includes a host 300. The memory controller 200 is coupled to the host 300. The memory controller 200 may manage the data stored in the memory 100 and communicate with the host 300 to implement functions of the electronic devices as described above.

In some implementations, the memory controller 200 and the memory 100 may be integrated into various types of storage devices.

As an example, the memory controller 200 and the memory 100 (e.g., a single memory) may be integrated into a memory card 400, as shown in FIG. 2. The memory card 400 may include a Personal Computer Memory Card International Association (PCMCIA, PC) card, a Compact Flash (CF) card, a Smart Media (SM) card, a memory stick, a Multi-Media Card (MMC), ultra-small MMC (RS-MMC), micro-MMC, Secure Digital (SD) card, Universal Flash Storage (UFS), etc. As shown in FIG. 2, the memory card 400 may further include a connector 410 for coupling the memory card 400 with the host 300.

As another example, as shown in FIG. 3, the memory controller 200 and the memory 100 (e.g., multiple memories) may be integrated into a Solid State Disk (SSD) 500. The solid state disk 500 may further include a connector 510 that couples the solid state disk 500 with the host 300. The storage capacity and/or operation speed of the solid state disk 500 may be greater than the storage capacity and/or operation speed of the memory card 400.

In addition, the memory 100 depicted in FIGS. 1-3 may be any memory involved in the implementations of the present application. For example, it may be 3D NAND (NAND gate) memory. The structure of the memory 100 is explained below.

FIG. 4 is a schematic diagram of a memory 100 according to an implementation of the present application. As shown in FIG. 4, the memory 100 may include one or more of the following. For example, the memory 100 may include a memory array 110 including a plurality of memory cell rows. The memory 100 may include a plurality of wordlines 120 coupled to the plurality of memory cell rows respectively. The memory 100 may include peripheral circuit 130 coupled to the plurality of wordlines 120 and configured to perform a verification operation or a program operation on a selected memory cell row of the plurality of memory cell rows. In some implementations, the selected memory cell row may be a memory cell row coupled to the selected wordline. In some implementations the peripheral circuit 130 may be configured to execute the method of operating the memory provided in the implementations of the present application to perform a verification operation or a program operation.

The memory array 110 may be a NAND flash memory array. As shown in FIG. 1, the NAND flash memory array includes a plurality of memory strings 111 arranged in an array on the substrate, and each memory string 111 extends vertically above the substrate (not shown). In some implementations, each memory string 111 includes a plurality of memory cells 112 coupled in series and stacked vertically.

As shown in FIG. 4, each memory string 111 may further include a source select gate (SSG) 113 at the bottom and a drain select gate (DSG) 114 at the top. The source selection gate is also called a lower select transistor, a bottom select gate (BSG), or a source select transistor, and the drain selection gate is also called an upper select transistor, a top select gate (TSG) or the drain select transistor. The source select gate 113 and the drain select gate 114 may be configured to activate a selected memory string 111 during read and program operations.

In some implementations, the drain select gate 114 of each memory string 111 is coupled to a corresponding bitline 115 from which data can be read or written via an output bus (not shown).

In some implementations, each memory string 111 is configured to apply a select voltage (e.g., higher than the threshold voltage of a transistor with a drain select gate 114) or a deselect voltage (e.g., 0 V) to the corresponding drain select gate 114 via one or more DSG lines 116. Additionally or alternatively, in some implementations, each memory string 111 is configured to be selected or deselected by applying a select voltage (e.g., higher than the threshold voltage of a transistor having a source select gate 113) or a deselect voltage (e.g., 0V) to the corresponding source select gate 113 via one or more SSG lines 117.

As shown in FIG. 4, the memory string 111 can be organized into a plurality of blocks 140, and for any block 140 in the plurality of blocks 140, the block 140 can have a source line (SL) 118. The sources of all the memory strings 111 of the block 140 are coupled via the source line 118, which is also called a common source line or an array common source (ACS).

The source line 118 can be used for grounding, so as to realize the grounding of the source of each memory cell of the memory strings in the block 140 later in some operations. In some examples, the source of each memory cell of the memory strings in the block 140 may also be connected to a high voltage via the source line 118 in some other operations.

Each block 140 is a basic data unit for an erase operation. That is, all memory cells 112 on the same block 140 are erased at the same time. To erase memory cells 112 in a selected block, the source line coupled to the selected block may be biased with an erase voltage (Vers), e.g., a high positive voltage (20V or higher).

It should be appreciated that in other implementations, erase operations may be performed at the half block level, at the quarter block level, or at any suitable number or fraction of blocks.

As shown in FIG. 4, the memory cells 112 of the same layer of adjacent memory strings 111 in the same block 140 may be coupled via the wordline 120. The wordline 120 is configured to select which layer of memory cells 112 in the block 140 is impacted by read and program operations.

In some implementations, each wordline 120 is coupled to the page to which the memory cell 112 belongs. A page is the basic unit of data used for program operations. The size of a page may be related to the number of memory strings 111 coupled by wordlines 120 in one block 140. Each wordline 120 may be coupled to the control gate (e.g., gate electrode) of each memory cell 112 in the corresponding page.

It should be noted that the same layer of memory cells in one block 140 corresponds to the same wordline, while the same layer of memory cells can be divided into one or more pages. That is, one wordline can be coupled to one or more pages. For example, for SLC, one wordline is coupled to one page. For MLC, one wordline is coupled to two pages.

FIG. 5 is a schematic cross-sectional view of a memory array 110 including memory strings 111 according to an implementation of the present application. As shown in FIG. 5, the memory string 111 may extend vertically above the substrate 101 and through the stacked layers 102. The substrate 101 may include silicon (e.g., monocrystalline silicon), silicon germanium (SiGe), gallium arsenide (GaAs), germanium (Ge), silicon-on-insulator (SOI), germanium-on-insulator (GOI), or any other suitable materials.

The stacked layers 102 may include alternating gate conductive layers 103 and gate-to-gate dielectric layers 104. The number of memory cells 112 in the memory array 110 may be determined by the number of pairs of gate conductive layers 103 and gate-to-gate dielectric layers 104 in the stacked layers 102.

The gate conductive layer 103 may include conductive materials including, but not limited to, e.g., tungsten (W), cobalt (Co), copper (Cu), aluminum (Al), polysilicon, doped silicon, silicide or any combination thereof. In some implementations, each gate conductive layer 103 includes a metal layer, e.g., such as a tungsten layer. In other implementations, each gate conductive layer 103 includes a doped polysilicon layer. In addition, each gate conductive layer 103 may include a control gate surrounding the memory cell 112 and may extend laterally at the top of the stacked layer 102 as a DSG line 116 and at the bottom of the stacked layer 102 as a SSG line 117, or extending laterally between the DSG line 116 and the SSG line 117 as the wordline 120.

As shown in FIG. 5, the memory string 111 includes a channel structure 105 extending vertically through the stacked layers 102. In some implementations, the channel structure 105 includes a channel hole filled with (one or more) semiconductor material (e.g., as a semiconductor channel) and (one or more) dielectric material (e.g., as a memory film). The semiconductor channel includes silicon, e.g., such as polysilicon. The memory film is a composite dielectric layer including a tunneling layer, a storage layer (also called "charge trapping/storage layer"), and a blocking layer.

In some implementations, the channel structure 105 has a cylindrical shape (e.g., a pillar shape). The layers in the semiconductor channel and the memory film are radially arranged in this order from the center of the cylinder toward the outer surface of the cylinder.

It should be understood that although not shown in FIG. 5, the memory array 110 may also include other additional components, including, but not limited to, e.g., gate line slits/source contacts, local contacts, interconnection layers, and the like.

Referring back to FIG. 4, the peripheral circuit 130 may be coupled to the memory array 110 via bitlines 115, wordlines 120, source lines 118, SSG lines 117, and DSG lines 116. The peripheral circuit 130 may include any suitable analog, digital, and mixed-signal circuitry for applying voltage and/or current signals to the memory cells 112 via bitlines 115, wordlines 120, source lines 118, SSG lines 117, and DSG lines 116 and sensing voltage signals and/or current signals from memory cells 112 to facilitate operation of the memory array 110.

The peripheral circuit 130 may include various types of peripheral circuits formed using metal-oxide-semiconductor (MOS) technology. For example, FIG. 6 shows some example peripheral circuits 130 including page buffer/sense amplifier 131, column decoder/bitline (BL) driver 132, row decoder/wordline (WL) driver 133, a voltage generator 134, a control logic unit 135, a register 136, an interface 137 and a data bus 138. It should be understood that in some examples, additional peripheral circuits not shown in FIG. 6 may also be included.

The page buffer/sense amplifier 131 may be configured to read data from and program (write) data to the memory array 110 according to control signals from the control logic unit 135. For example, the page buffer/sense amplifier 131 may store one page of program data (write data) to be programmed into one page 130 of the memory array 110. The page buffer/sense amplifier 131 may also perform a verification operation to ensure that data has been correctly programmed into the memory cell 112 coupled to the selected wordline 120. The page buffer/sense amplifier 131 can also sense a low power signal from bitline 115 that represents a data bit stored in the memory cell 112, and amplify the small voltage swing to recognized logic level during the read operation.

The column decoder/bitline driver 132 may be configured to be controlled by the control logic unit 135 and select one or more memory strings 111 by applying the bitline voltage generated from the voltage generator 134.

The row decoder/wordline driver 133 may be configured to be controlled by the control logic unit 135 and select/deselect the blocks 140 of the memory array 110 and the wordlines 120 of the blocks 140. The row decoder/wordline driver 133 may also be configured to drive the wordline 120 using the wordline voltage (VWL) generated from the voltage generator 134. In some implementations, the row decoder/wordline driver 133 can also select/deselect and drive the SSG line 117 and the DSG line 116. As described in detail below, the row decoder/wordline driver 133 is configured to perform an erase operation on the memory cell 112 coupled to the selected wordline(s) 120.

The voltage generator 134 may be configured to be controlled by the control logic unit 135, and generate wordline voltages (e.g., read voltages, program voltages, pass voltages, local voltages, verification voltages, etc.) to be supplied to the memory array 110, bitline voltages, and source line voltages.

The control logic unit 135 may be coupled to each of the above-described peripheral circuits and configured to control the operation of each of the circuits.

The register 136 may be coupled to the control logic unit 135, and the register may include a status register, a command register, and an address register for storing status information, command operation code (OP code) and command address for controlling the operation of each circuit in the peripheral circuit.

An interface (I/F) 137 may be coupled to the control logic unit 135 and act as a control buffer to buffer and relay control commands received from a host (not shown) to the control logic unit 135 and to buffer and relay the status information received from the control logic unit 135 to the host. The interface 137 may also be coupled to column decoder/bitline driver 132 via data bus 138 and act as a data I/O interface and data buffer to buffer and relay data to and from the memory array 110.

The above descriptions of the memory-related hardware implementations have beneficial effects similar to those of the following method implementations. Technical details not disclosed in the memory-related hardware implementations may be understood by referring the description of the method implementations of the present application.

Taking the memory system shown in FIG. 1 as an example, the memory system includes one or more memory, and a memory controller coupled to the memories and configured to control the memories. The memory includes a memory array, the memory array is coupled to n wordlines, and the n wordlines are sequentially arranged by physical wordline identifiers, where n≥2.

In this implementation, the memory controller is configured to obtain multiple pieces of data to be written into the memory array, and map n physical wordline identifiers into n virtual wordline identifiers. The physical wordline identifiers respectively corresponding to m adjacent virtual wordline identifiers are spaced apart from each other, where 2≤m≤n. The memory controller is configured to generate check data based on data corresponding to the m adjacent virtual wordline identifiers. In some implementations, the check data may be configured to check and recover the data corresponding to the m adjacent virtual wordline identifiers.

In some implementations, the memory controller is configured to obtain a preset mapping relationship table, the mapping relationship table including mapping correspondence between the physical wordline identifiers and the virtual wordline identifiers. The memory controller is configured to obtain the n virtual wordline identifiers corresponding to the n physical wordline identifiers by matching the n physical wordline identifiers with the mapping relationship table.

In some implementations, the memory controller is configured to obtain the preset mapping relationship table from a static random access memory.

In some implementations, a reference number of the physical wordline identifiers are distributed between the physical wordline identifiers respectively corresponding to the m adjacent virtual wordline identifiers.

In some implementations, the memory controller is configured to obtain a preset algorithm, the preset algorithm being configured to map the physical wordline identifiers to the virtual wordline identifiers, and to substitute the n physical wordline identifiers into the preset algorithm to obtain the n virtual wordline identifiers corresponding to the n physical wordline identifiers.

In some implementations, the memory controller is configured to process the data corresponding to the m adjacent virtual wordline identifiers through a first operator to obtain the check data. In some implementations, the check data is configured to check and recover the data that failed to be read through a second operator when there is a data reading failure in the data corresponding to the m adjacent virtual wordline identifiers, and the first operator and the second operator are operators whose operation logics are opposite.

In some implementations, the memory controller is configured to send a first read instruction to the memory, the first read instruction including a first physical wordline identifier corresponding to first data to be read, and to receive a data read result returned by the memory. In some implementations, the memory controller is configured to determine a first virtual wordline identifier corresponding to the first physical wordline identifier when the data read result indicates that the reading of the first data corresponding to the first physical wordline identifier fails, and to obtain target check data corresponding to the first virtual wordline identifier to recover the first data that failed to be read.

In some implementations, the memory controller is configured to obtain the target check data corresponding to the first virtual wordline identifier, to obtain a second virtual wordline identifier that is matched with the first virtual wordline identifier to generate the target check data, and to determine a second physical wordline identifier corresponding to the second virtual wordline identifier. In some implementations, the memory controller is configured to send a second read instruction to the memory. The second read instruction may include the second physical wordline identifier and configured to instruct the memory to read the data stored in memory cell rows coupled to the wordline corresponding to the second physical wordline identifier, to receive second data that is returned by the memory and corresponds to the second physical wordline identifier, and to recover the first data that failed to be read based on the target check data and the second data.

In some implementations, the memory controller is configured to determine a first virtual wordline identifier corresponding to a first physical wordline identifier when reading first data corresponding to the first physical wordline identifier, to obtain the target check data corresponding to the first virtual wordline identifier, to obtain a second virtual wordline identifier that is matched with the first virtual wordline identifier to generate the target check data, and to determine a second physical wordline identifier corresponding to the second virtual wordline identifier. In some implementations, the memory controller is configured to send a read instruction to the memory. The read instruction may be configured to instruct to read the data stored in memory cell rows coupled to the wordline corresponding to the first physical wordline identifier and the second physical wordline identifier. In some implementations, the memory controller is configured to receive a data read result returned by the memory; and when the data read result indicates that the reading of the first data fails, the memory controller is configured to use the target check data and the second data corresponding to the second physical wordline identifier to recover the first data that failed to be read.

FIG. 7 is a flow chart of the method of operating the memory system according to an example implementation of the present application. Taking the method being applied to the memory system as an example, as shown in FIG. 7, the method may include operations 701 and 702.

For example, at 701, the method may include obtaining multiple pieces of data to be written into the memory array. The multiple pieces of data are data to be written into the memory array of the memory. In some implementations, the memory array includes n memory cell rows, and the n memory cell rows are respectively coupled to n wordlines, where the $i^{th}$ memory cell row is coupled to the $i^{th}$ wordline, and i is less than a positive integer equal to n. The multiple pieces of data are data to be written into n memory cell rows. The n wordlines coupled to the n memory cell rows are sequentially arranged by the physical wordline identifier. That is, each of the n wordlines corresponds to a physical wordline identifier, to uniquely indicate the wordline according to the order of the wordline arrangement. In some implementations, the memory controller in the memory system receives multiple pieces of data to be written into the memory array. Alternatively, the memory controller actively obtains multiple pieces of data to be written into the memory array periodically. In some implementations, the memory controller writes the multiple pieces of data into the memory array based on the physical wordline identifier after obtaining the multiple pieces of data.

At 702, the method may include writing check data into the memory, the check data being data generated based on data corresponding to physical wordline identifiers spaced apart from each other and being configured to check and recover the data. The memory controller first determines the arrangement of multiple pieces of data written in the memory cell row, that is, the data corresponds to the physical wordline identifier corresponding to the written memory cell row. For example, there are data a, data b, data c, and data d, where data a is written into the memory cell rows coupled to wordline 1, data b is written into the memory cell rows coupled to wordline 2, data c is written into the memory cell rows coupled to wordline 3, and data d is written into the memory cell rows coupled to wordline 4. The memory controller generates check data based on the arrangement of multiple pieces of data written in the memory cell row, and writes the check data to the memory. The check data is generated based on the data corresponding to the physical wordline identifiers that are spaced apart. That is, taking the above-mentioned data a, data b, data c and data d as examples, since wordline 2 is spaced between wordline 1 and wordline 3, and wordline 3 is spaced between wordline 2 and wordline 4, the check data is generated based on data a and data c, while the check data is generated based on data b and data d.

In some implementations, when generating the check data based on the data corresponding to the physical wordline identifiers that are spaced apart, firstly, n physical wordline identifiers are mapped to n virtual wordline identifiers, where the physical wordline identifiers respectively corresponding to m adjacent virtual wordline identifiers are spaced apart from each other, where $2 \le m \le n$. The check data is generated based on the data corresponding to the m adjacent virtual wordline identifiers and is configured to check and recover the data corresponding to the m adjacent virtual wordline identifiers. As an example, m to be 2 is taken as an example for illustration. That is, the check data is generated based on the data corresponding to two adjacent virtual wordline identifiers, and the physical wordline identifiers respectively corresponding to the two adjacent virtual wordline identifiers are spaced apart from each other.

In some examples, the m virtual wordline identifiers include adjacent first virtual wordline identifiers and second virtual wordline identifiers, where the first virtual wordline identifier is mapped to the first physical wordline identifier, the second virtual wordline identifier is mapped to the second physical wordline identifier, and at least one physical wordline identifier is distributed between the first physical wordline identifier and the second physical wordline identifier.

In some implementations, a physical wordline identifier is distributed between the first physical wordline identifier and the second physical wordline identifier. That is, by spacing a physical wordline, the check data is generated based on the data corresponding to the spaced physical wordlines. Alternatively, a plurality of physical wordline identifiers are distributed between the first physical wordline identifier and the second physical wordline identifier. For instance, a reference number of physical wordline identifiers are distributed between physical wordline identifiers respectively corresponding to m adjacent virtual wordline identifiers. That is, by spacing the plurality of physical wordlines, check data is generated for the data corresponding to the spaced physical wordlines. Alternatively, the number of the physical wordline identifier distributed between the first physical wordline identifier and the second physical wordline identifier is an uncertain number determined based on an algorithm. That is, by spacing one or more physical wordlines, the check data is generated for the data corresponding to the spaced physical wordlines.

By way of example, when mapping between physical wordline identifiers and virtual wordline identifiers, at least one of the following approaches is employed.

First, a preset mapping relationship table is obtained, which includes the mapping relationship between physical wordline identifiers and virtual wordline identifiers; and by matching n physical wordline identifiers with the mapping relationship table, n virtual wordline identifiers corresponding to the n physical wordline identifiers are obtained.

In some implementations, the mapping relationship table is stored in a Static Random-Access Memory (SRAM), and the preset mapping relationship table is obtained from the SRAM. Alternatively, the mapping relationship table is stored in a 3D NAND memory, and the memory controller obtains the preset mapping relationship table from 3D NAND.

In some implementations, the correspondence between the physical wordline identifier and the virtual wordline identifier is stored in the mapping relationship table in the form of a key-value pair. By way of example, the physical wordline identifier 1 is stored in the form of a key, and the virtual wordline identifier 1 corresponding to the physical wordline identifier 1 is stored in the form of a value. The physical wordline identifier 2 is stored in the form of a key, and the virtual wordline identifier 6 corresponding to the physical wordline identifier 1 is stored in the form of a value. FIG. 8 shows a schematic diagram of a mapping relationship table, according to an example implementation of the present application. As shown in FIG. 8, the virtual wordline identifiers 810 marked as 1-5 respectively correspond to the physical wordline identifiers 820 marked as 1/6/11/16/21, the corresponding data 830 are respectively Data1/Data6/ Data11/Data16/Data21, and the generated check data 840 is Parity1; the virtual wordline identifiers 810 marked as 6-10 respectively correspond to the physical wordline identifiers 820 marked as 26/31/36/41/46, the corresponding data 830 are respectively Data26/Data31/Data36/Data41/Data46, and the generated check data 840 is Parity2; and so on.

It is noted that, in the above mapping relationship table, the physical wordline identifiers corresponding to two adjacent virtual wordline identifiers are spaced by 4 physical wordline identifiers as an example. However, the number of spacing above are only illustrative examples. In some implementations, taking a check data generated by 5 wordlines as an example, the virtual wordline identifiers 1-5 can also correspond to the physical wordline identifiers 1/3/5/7/9, and the virtual wordline identifiers 6-10 correspond to the physical wordline identifiers 2/4/6/8/10, and so on. That is, there is one physical wordline identifier spaced between the physical wordline identifiers corresponding to two adjacent virtual wordline identifiers. Alternatively, the virtual wordline identifiers 1-5 may also correspond to physical wordline identifiers 1/4/7/10/13, virtual wordline identifiers 6-10 correspond to physical wordline identifiers 2/5/8/11/14, and so on. That is, there are two physical wordline identifiers spaced between the physical wordline identifiers corresponding to two adjacent virtual wordline identifiers. Alternatively, on the basis of ensuring a one-to-one correspondence between the virtual wordline identifier and the physical wordline identifier, there are any number of physical wordline identifiers spaced between the physical wordline identifiers corresponding to two adjacent virtual wordline identifiers. The implementation of the present application does not limit the number of spacings. In some implementations, the number of spacings between physical wordline identifiers corresponding to two different groups of adjacent virtual wordline identifiers may be different.

Second, a preset algorithm is obtained, which is configured to map physical wordline identifiers to virtual wordline identifiers, and n physical wordline identifiers are substituted into the preset algorithm to obtain n virtual wordline identifiers corresponding to n physical wordline identifiers.

In some implementations, pre-stored preset algorithms are obtained from SRAM.

In some examples, the preset algorithm includes a parameter substitution bit of the physical wordline identifier. After substituting the physical wordline identifier into the parameter substitution bit, the virtual wordline identifier corresponding to the physical wordline identifier is output through algorithmic processing of the preset algorithm.

Taking 50 physical wordline identifiers as an example, the physical wordline identifiers are 1-50 in sequence, and the preset algorithm may be implemented as follows. For instance, when the physical wordline identifier is an odd number, the virtual wordline identifier is equal to the physical wordline identifier, and when the physical wordline identifier is an even number, the virtual wordline identifier is equal to 50 minus the value of the physical wordline identifier.

It should be noted that, the above method of mapping between physical wordline identifiers and virtual wordline identifiers is only an illustrative example, and is not limited in this implementations of the present application.

In some implementations, when generating check data, at least one of the following approaches is employed.

For instance, in one approach, an operation is performed on data corresponding to m adjacent virtual wordline identifiers through an exclusive OR algorithm to obtain check data. In some implementations, the check data may be generated by way of parity check. As an example, for any piece of data, the total number of bits that are 1 in each bit of the data under the binary code is determined, and then check data is generated for recording the parity of the total number to facilitate subsequent check of the read data according to the check data.

In another approach, the data corresponding to the m adjacent virtual wordline identifiers is processed through the first operator to obtain the check data, where the check data is configured to check and recover the data that failed to be read through a second operator when there is a data reading failure in the data corresponding to the m adjacent virtual wordline identifiers, and the first operator and the second operator are operators whose operation logics are opposite.

FIG. 9 is a schematic diagram of a check data generation process according to an example implementation of the present application. As shown in FIG. 9, K data 900 to be written into the memory are firstly obtained, where data 1 is written into physical wordlines 1-5, data 2 is written into physical wordlines 6-10, and so on, data K is written into physical wordlines k to k+4. First, the physical wordline identifier is mapped to the virtual wordline identifier by mapping 910, where the physical wordline identifiers 1-5 are mapped to the virtual wordline identifiers 1/6/11/16/21, and the physical wordline identifiers 6-10 are mapped to the virtual wordline identifiers 2/7/12/17/22. After mapping between the virtual wordline identifier and the physical wordline identifier, the data 920 of continuous virtual wordline identifier is obtained. For example, the data of virtual wordline identifier 1-5 is obtained, and the check data 1 is obtained by integrating 930. The data of the virtual wordline identifier 6-10 is obtained, and the check data 2 is obtained by integrating 930, and so on.

In some implementations, sequential write operations are performed on the memory by a logic analyzer, and it is observed whether the NAND write address sent by the memory controller on the logic analyzer is a non-sequential WL number. If it is non-sequential WL number, it proves that the method of operating the memory system according to implementations of the present application is used.

In other words, in accordance with the method provided by the implementations of the present application, a virtual wordline identifier corresponding to the physical wordline identifier is generated by setting the mapping relationship between the physical wordline identifier and the virtual wordline identifier, so that the physical wordline identifiers corresponding to adjacent virtual wordline identifiers are spaced apart, that is, non-adjacent. The check data is generated with data corresponding to multiple adjacent virtual wordline identifiers. That is, the check data is generated with the data corresponding to multiple non-adjacent physical wordline identifiers, thereby reducing the influence on the check data due to the mutual influence between adjacent physical wordlines, increasing the success rate of data recovery, and improving the reliability of data storage and reading.

In accordance with the method provided in this implementation, by setting the mapping relationship table in advance, one-to-one correspondence between the physical wordline identifier and the virtual wordline identifier is intuitively carried out, so that the physical wordline identifier is mapped to the virtual wordline identifier through the mapping relationship table, which improves the efficiency of determining the virtual wordline identifier.

The method provided in this implementation matches the physical wordline identifier with the virtual wordline identifier by a preset algorithm, thereby mapping the physical wordline identifier to a virtual wordline identifier by the preset algorithm, which improves the efficiency of determining the virtual wordline identifier.

In an example implementation, after the check data is generated and stored, a process of reading the stored data is further included. FIG. 10 is a flowchart of a method of operating the memory system according to another example implementation of the present application. As a non-limiting example, the method may be applied to the memory system shown in FIG. 1 and executed after operation 702 shown in FIG. 7. The method may include operations 1001, 1021, 1022, 1031, 1032, 1041, 1042, 1052, and 1062, for example.

Referring to FIG. 10, at 1001, the method may include sending a first read instruction to a memory, where the first read instruction includes a first physical wordline identifier corresponding to first data to be read. From the perspective of the memory, the data is still accessed by the physical wordline identifier. Therefore, when reading data, the first read instruction with the first physical wordline identifier is sent to the memory, and data reading is carried out on the memory cell rows coupled to the wordline corresponding to the first physical wordline identifier. In some implementations, when the computer device where the memory system is located receives the data read operation, the first read instruction is sent to the memory by the memory controller, and the first data stored in the memory cell rows coupled to the wordline corresponding to the first physical wordline identifier is read. In some implementations, the data reading process corresponding to the first read instruction includes at least one of the following situations. First, the virtual wordline identifier is determined and check data is obtained in the case of failing to read data.

At 1021, the method may include receiving the data read result returned by the memory. In the case where the first data can be read normally, the data read result includes the first data read from the memory cell row coupled to the wordline corresponding to the first physical wordline identifier. In the case where the first data cannot be read normally, for example, when the memory cell rows coupled to the wordline corresponding to the first physical wordline identifier is corrupted, the first data cannot be read correctly, and the data read result includes an indicator indicating that the reading of the first data failed. That is to say, the data read result includes at least one of: 1) data obtained from the reading, and/or 2) an indicator of the reading failure. In some implementations, the first read instruction is configured to read a plurality of first physical wordlines. Then the first data includes sub-data respectively corresponding to the plurality of physical wordlines, and the data read result may further include an indicator indicating that reading of part of data failed. In some implementations, the data read result includes the first physical wordline identifier corresponding to the failed read data and other successfully read data.

At 1031, if the data read result indicates that the reading of the first data corresponding to the first physical wordline identifier fails, the method may include determining the first virtual wordline identifier corresponding to the first physical wordline identifier. In some examples, when generating the check data, it is generated by mapping the physical wordline identifier to the virtual wordline identifier. Thus, the first physical wordline identifier is mapped in the same mapping manner to determine the corresponding first virtual wordline identifier. By way of example, when generating the check data, the physical wordline identifier is mapped to the virtual wordline identifier through the mapping relationship table. In the case of failure to read the first data, the first virtual wordline identifier corresponding to first physical wordline identifier is determined through the mapping relationship table. When generating the check data, the physical wordline identifier is mapped to the virtual wordline identifier through a preset algorithm. In the case of failure to read the first data, the first virtual wordline identifier corresponding to the first physical wordline identifier is determined by a preset algorithm.

At 1041, obtaining target check data corresponding to the first virtual wordline identifier to recover the first data that failed to be read. In some implementations, the target check data corresponding to the first virtual wordline identifier is read from the memory so as to check the first data. In some implementations, the target check data corresponding to the first virtual wordline identifier is obtained, and the second virtual wordline identifier that is matched with the first virtual wordline to generate the target check data is obtained. In some examples, during the check data storage process, the check data, and the physical wordline identifier and the virtual wordline identifier corresponding to the data for generating the check data are correspondingly stored, and then the corresponding second virtual wordline identifier in the target check data containing the first virtual wordline identifier is obtained to determine the second physical wordline identifier corresponding to the second virtual wordline identifier. In some examples, when generating the check data, the physical wordline identifier is mapped to the virtual wordline identifier by mapping, and the second virtual wordline identifier is mapped to the corresponding second physical wordline identifier by reverse mapping. By way of example, when generating the check data, the physical wordline identifier is mapped to the virtual wordline identifier through the mapping relationship table, and the second virtual wordline identifier is still mapped to the second physical wordline identifier through the mapping relationship table. When generating the check data, the physical wordline identifier is mapped to the virtual wordline identifier through a preset algorithm, and then the second virtual wordline identifier is substituted by the preset algorithm to determine the corresponding second physical wordline identifier.

A second read instruction is sent to the memory. The second read instruction includes a second physical wordline identifier, and the second read instruction is configured to instruct the memory to read the data stored in the memory cell row coupled to the wordline corresponding to the second physical wordline identifier, receive the second data corresponding to the second physical wordline identifier returned by the memory, and recover the first data that failed to be read based on the target check data and the second data.

By way of example, FIG. 11 is a schematic diagram of data check and recovery process according to an example implementation of the present application. As shown in FIG. 11, when the memory controller 1101 sends to the memory 1102 a read instruction instructing to read the data corresponding to physical wordline identifiers 1-5, the memory 1102 feeds back to the memory controller 1101 that the data corresponding to the physical wordline identifier 5 fails to be read. Then, the memory controller 1101 first determines the virtual wordline identifier 21 corresponding to the physical wordline identifier 5 through the mapping 1110, and determines the check data n corresponding to the virtual wordline identifier 21 through the check data lookup 1120. Other virtual wordline identifiers p that make up the check data n are obtained through searching 1130 the data for generating the check data n, and the physical wordline identifier q corresponding to the virtual wordline identifier p is determined through the mapping 1140. The memory controller 1101 sends to the memory 1102 the read instruction instructing to read the data corresponding to the physical wordline identifier q. After the memory 1102 feeds back the data q to the memory controller 1101, the memory controller 1101 checks and recovers the data corresponding to the physical wordline identifier 5.

In a second way, the target check data and the second data are obtained in advance, and check is performed through the target check data and the second data when the first data fails to be read.

Referring again to FIG. 10, at 1022, the method may include determining the first virtual wordline identifier corresponding to the first physical wordline identifier, and obtaining target check data corresponding to the first virtual wordline identifier. In some implementations, when generating the check data, the physical wordline identifier is mapped to the virtual wordline identifier through the mapping relationship table. In the case of failure to read the first data, the first virtual wordline identifier corresponding to the first physical wordline identifier is determined through the mapping relationship table. When generating the check data, the physical wordline identifier is mapped to the virtual wordline identifier through a preset algorithm. In the case of failure to read the first data, the first virtual wordline identifier corresponding to a first physical wordline identifier is determined through the preset algorithm.

At 1032, the method may include obtaining a second virtual wordline identifier that is matched with the first virtual wordline identifier to generate the target check data, and determining a second physical wordline identifier corresponding to the second virtual wordline identifier. In some implementations, the target check data corresponding to the first virtual wordline identifier is obtained, and the second virtual wordline identifier that is matched with the first virtual wordline to generate the target check data is obtained.

In some examples, during the check data storage process, the check data, and the physical wordline identifier and the virtual wordline identifier corresponding to the data for generating the check data are correspondingly stored, and then the corresponding second virtual wordline identifiers in the target check data containing the first virtual wordline identifier is obtained to determine the second physical wordline identifier corresponding to the second virtual wordline identifier. In some examples, when generating the check data, the physical wordline identifier is mapped to the virtual wordline identifier by mapping, and the second virtual wordline identifier is mapped to the corresponding second physical wordline identifier by reverse mapping.

At 1042, the method may include sending a second read instruction to the memory, where the second read instruction includes a second physical wordline identifier. The second read instruction is configured to instruct the memory to read data stored in the memory cell rows coupled to the wordline corresponding to the second physical wordline identifier.

At 1052, the method may include receiving the data read result returned by the memory. In some examples, the data read result includes the result of reading the memory cell row coupled to the wordline corresponding to the first physical wordline identifier, and the result of reading the memory cell row coupled to the wordline corresponding to the second physical wordline identifier. In the implementation of the present application, for the case where the reading of the first data fails and the reading of the second data succeeds, the first data is checked and recovered.

At 1062, in the case where the data read result indicates that the reading of the first data fails, the method may include using the target check data and the second data corresponding to the second physical wordline identifier to recover the first data that failed to be read.

In other words, in accordance with the method provided by the implementations of the present application, a virtual wordline identifier corresponding to the physical wordline identifier is generated by setting the mapping relationship between the physical wordline identifier and the virtual wordline identifier, so that the physical wordline identifiers corresponding to adjacent virtual wordline identifiers are spaced apart, that is, non-adjacent. The check data is generated with data corresponding to multiple adjacent virtual wordline identifiers. That is, the check data is generated with the data corresponding to multiple non-adjacent physical wordline identifiers, thereby reducing the influence on the check data due to the mutual influence between adjacent physical wordlines, increasing the success rate of data recovery, and improving the reliability of data storage and reading.

In the method provided by this implementation, in the case of data reading failure, the data is checked and recovered by means of the check data. On the one hand, the incapability of checking and recovering the data by the check data due to the mutual influence between adjacent wordlines is avoided. On the other hand, the security and accuracy of data storage are improved.

FIG. 12 is a schematic structural diagram of a memory controller according to an example implementation of the present application. The method of operating the memory system provided in the implementations of the present application is mainly implemented by the memory controller. As shown in FIG. 12, the memory controller 1200 includes a memory interface 1210, a memory controller 1220, a configuration registers 1230 and a bus interface 1240.

The memory interface 1210 is configured to connect to the memory, and convert the data exchange on the bus into the data exchange conforming to the storage timing of the storage medium.

The memory controller 1220 is configured to control the functions of the memory controller as a whole, control the memory interface to correctly complete the data exchange between the memory and the internal bus of the Microcontroller Unit (MCU), and be responsible for the management of interrupt signals.

The configuration register 1230 is configured to configure the functions of the memory controller, such as timing configuration of the memory interface.

The bus interface 1240 is configured to connect to the internal bus of the MCU so that, e.g., 1) configuration information of the memory controller is transmitted and/or 2) stored data conforming to the interface of the memory controller is transmitted.

In some implementations, the memory controller 1200 includes at least two interfaces. The at least two interfaces include at least one interface for communicating with the memory, and further include at least one front-end interface for communicating with the host.

An implementation of the present application provides a control circuit. The control circuit includes a programmable logic circuit and/or program instructions, and can be used to implement the method of operating the memory system provided in the foregoing implementations of the present application.

An implementation of the present application provides a computer-readable storage medium where instructions are stored. The instructions, when executed on the memory controller, implement the method of operating the memory system as provided in the foregoing implementations of the present application.

In the present application, the terms "first" and "second" are merely for descriptive purposes, and should not be construed as indicating or implying relative importance. The term "at least one" means one or more, and the term "multiple" means two or more, unless otherwise clearly defined.

The term "and/or" in this application is merely an association relationship describing associated objects, which means that there may be three relationships. For example, A and/or B means A alone, both A and B, and B alone. In addition, the character "/" herein generally indicates that the contextual objects are in a relation of "or".

The foregoing descriptions are only example implementations of the application, and are not intended to limit the application. Any modifications, equivalent replacements, improvements and the like made within the spirit and principles of the application shall be encompassed within the protection range of the present application.

What is claimed is:

1. A memory system, comprising:

at least one memory, comprising:

a memory array coupled to n wordlines, the n wordlines being sequentially arranged by physical wordline identifiers, where n≥2; and a memory controller coupled to the at least one memory and configured to:

obtain multiple pieces of data to be written into the memory array;

map n physical wordline identifiers to n virtual wordline identifiers, the physical wordline identifiers respectively corresponding to m adjacent virtual wordline identifiers spaced apart from each other, where 2≤m≤n; and generate check data based on data corresponding to the m adjacent virtual wordline identifiers, the check data being configured to check and recover the data corresponding to the m adjacent virtual wordline identifiers.

2. The memory system of claim 1, wherein the memory controller is further configured to:

obtain a preset mapping relationship table, the preset mapping relationship table comprising mapping correspondence between the physical wordline identifiers and the virtual wordline identifiers; and obtain the n virtual wordline identifiers corresponding to the n physical wordline identifiers by matching the n physical wordline identifiers with the preset mapping relationship table.

3. The memory system of claim 2, wherein the memory controller is further configured to:

obtain the preset mapping relationship table from a static random access memory.

4. The memory system of claim 1, wherein:

reference numbers of the physical wordline identifiers are distributed between the physical wordline identifiers respectively corresponding to the m adjacent virtual wordline identifiers.

5. The memory system of claim 1, wherein the memory controller is configured to:

obtain a preset algorithm, the preset algorithm being configured to map the physical wordline identifiers to the virtual wordline identifiers; and substitute the n physical wordline identifiers into the preset algorithm to obtain the n virtual wordline identifiers corresponding to the n physical wordline identifiers.

6. The memory system of claim 1, wherein the memory controller is further configured to:

process the data corresponding to the m adjacent virtual wordline identifiers through a first operator to obtain the check data, wherein the check data is configured to check and recover the data that failed to be read through a second operator when there is a data reading failure in the data corresponding to the m adjacent virtual wordline identifiers, and wherein the first operator and the second operator are operators whose operation logics are opposite.

7. The memory system of claim 1, wherein the memory controller is further configured to:

send a first read instruction to the memory, the first read instruction comprising a first physical wordline identifier corresponding to first data to be read;

receive a data read result returned by the memory;

determine a first virtual wordline identifier corresponding to the first physical wordline identifier when the data read result indicates that a reading of the first data corresponding to the first physical wordline identifier fails; and obtain target check data corresponding to the first virtual wordline identifier to recover the first data that failed to be read.

8. The memory system of claim 7, wherein the memory controller is further configured to:

obtain the target check data corresponding to the first virtual wordline identifier;

obtain a second virtual wordline identifier that is matched with the first virtual wordline identifier to generate the target check data;

determine a second physical wordline identifier corresponding to the second virtual wordline identifier;

send a second read instruction to the memory, the second read instruction comprising the second physical wordline identifier and configured to instruct the memory to read the data stored in memory cell rows coupled to a wordline corresponding to the second physical wordline identifier;

receive second data that is returned by the memory and corresponds to the second physical wordline identifier; and recover the first data that failed to be read based on the target check data and the second data.

9. The memory system of claim 1, wherein the memory controller is further configured to:

determine a first virtual wordline identifier corresponding to a first physical wordline identifier when reading first data corresponding to the first physical wordline identifier;

obtain a target check data corresponding to the first virtual wordline identifier;

obtain a second virtual wordline identifier that is matched with the first virtual wordline identifier to generate the target check data;

determine a second physical wordline identifier corresponding to the second virtual wordline identifier;

send a read instruction to the memory, the read instruction being configured to instruct to read the data stored in memory cell rows coupled to a wordline corresponding to the first physical wordline identifier and the second physical wordline identifier;

receive a data read result returned by the memory; and when the data read result indicates that a reading of the first data fails, use the target check data and second data corresponding to the second physical wordline identifier to recover the first data that failed to be read.

10. A method of operating a memory, comprising obtaining multiple pieces of data to be written into a memory array of the memory, the memory array being coupled to n wordlines, and the n wordlines being sequentially arranged by physical wordline identifiers, where n≥2; and writing check data into the memory, the check data being data generated based on data corresponding to physical wordline identifiers spaced apart from each other and being configured to check and recover data.

11. The method of claim 10, wherein, prior to writing the check data into the memory, the method further comprises:

mapping n physical wordline identifiers into n virtual wordline identifiers, the physical wordline identifiers respectively corresponding to m adjacent virtual wordline identifiers being spaced apart from each other, where 2≤m ≤n; and generating the check data based on data corresponding to the m adjacent virtual wordline identifiers, the check data being configured to check and recover the data corresponding to the m adjacent virtual wordline identifiers.

12. The method of claim 11, wherein the mapping the n physical wordline identifiers into the n virtual wordline identifiers comprises:

obtaining a preset mapping relationship table, the preset mapping relationship table comprising mapping correspondence between the physical wordline identifiers and the virtual wordline identifiers; and obtaining the n virtual wordline identifiers corresponding to the n physical wordline identifiers by matching the n physical wordline identifiers with the preset mapping relationship table.

13. The method of claim 12, wherein the obtaining the preset mapping relationship table comprises:

obtaining the preset mapping relationship table from a static random access memory.

14. The method of claim 11, wherein reference numbers of the physical wordline identifiers are distributed between the physical wordline identifiers respectively corresponding to the m adjacent virtual wordline identifiers.

15. The method of claim 11, wherein the mapping the n physical wordline identifiers into the n virtual wordline identifiers comprises:

obtaining a preset algorithm, the preset algorithm being configured to map the physical wordline identifiers to the virtual wordline identifiers; and substituting the n physical wordline identifiers into the preset algorithm to obtain the n virtual wordline identifiers corresponding to the n physical wordline identifiers.

16. The method of claim 11, wherein the generating the check data based on the data corresponding to the m adjacent virtual wordline identifiers comprises:

processing the data corresponding to the m adjacent virtual wordline identifiers through a first operator to obtain the check data, wherein the check data is configured to check and recover the data that failed to be read through a second operator when there is a data reading failure in the data corresponding to the m adjacent virtual wordline identifiers, and wherein the first operator and the second operator are operators whose operation logics are opposite.

17. The method of claim 16, wherein, after writing the check data to the memory, the method further comprises:

sending a first read instruction to the memory, the first read instruction comprising a first physical wordline identifier corresponding to first data to be read;

receiving a data read result returned by the memory;

determining a first virtual wordline identifier corresponding to the first physical wordline identifier when the data read result indicates that a reading of the first data corresponding to the first physical wordline identifier fails; and obtaining target check data corresponding to the first virtual wordline identifier to recover the first data that failed to be read.

18. The method of claim 17, wherein the obtaining the target check data corresponding to the first virtual wordline identifier to recover the first data that failed to be read comprises:

obtaining the target check data corresponding to the first virtual wordline identifier, and obtaining a second virtual wordline identifier that is matched with the first virtual wordline identifier to generate the target check data;

determining a second physical wordline identifier corresponding to the second virtual wordline identifier;

sending a second read instruction to the memory, the second read instruction comprising the second physical wordline identifier and being configured to instruct the memory to read the data stored in memory cell rows coupled to the wordline corresponding to the second physical wordline identifier; and receiving second data that is returned by the memory and corresponds to the second physical wordline identifier, and recovering the first data that failed to be read based on the target check data and the second data.

19. The method of claim 18, wherein, after generating the check data based on the data corresponding to the m adjacent virtual wordline identifiers, the method further comprises:

sending a first read instruction to the memory, the first read instruction comprising a first physical wordline identifier corresponding to the first data to be read;

determining a first virtual wordline identifier corresponding to the first physical wordline identifier;

obtaining the target check data corresponding to the first virtual wordline identifier;

obtaining a second virtual wordline identifier that is matched with the first virtual wordline identifier to generate the target check data;

determining a second physical wordline identifier corresponding to the second virtual wordline identifier;

sending a second read instruction to the memory, the second read instruction comprising the second physical wordline identifier and being configured to instruct the memory to read the data stored in memory cell rows coupled to the wordline corresponding to the second physical wordline identifier;

receiving a data read result returned by the memory; and when the data read result indicates that a reading of the first data fails, using the target check data and the second data corresponding to the second physical wordline identifier to recover the first data that failed to be read.

20. A non-transitory computer-readable storage medium having stored therein instructions, which when executed on a memory controller, cause the memory controller to perform:

obtaining multiple pieces of data to be written into a memory array of a memory, the memory array being coupled to n wordlines, and the n wordlines being sequentially arranged by physical wordline identifiers, where n≤2; and writing check data into the memory, the check data being data generated based on data corresponding to physical wordline identifiers spaced apart from each other and being configured to check and recover data.

* * * * *